(12) United States Patent
Kolar (10) Patent No.: US 11,733,898 B2
(45) Date of Patent: Aug. 22, 2023

(54) MEMORY ARRAY FOR STORING ODD AND EVEN DATA BITS OF DATA WORDS IN ALTERNATE SUB-BANKS TO REDUCE MULTI-BIT ERROR RATE AND RELATED METHODS

(71) Applicant: Microsoft Technology Licensing, LLC, Redmond, WA (US)

(72) Inventor: Pramod Kolar, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/240,935

(22) Filed: Apr. 26, 2021

(65) Prior Publication Data

US 2022/0342576 A1 Oct. 27, 2022

(51) Int. Cl.
*G06F 3/06* (2006.01)

(52) U.S. Cl.
CPC .......... *G06F 3/0644* (2013.01); *G06F 3/0604* (2013.01); *G06F 3/0679* (2013.01)

(58) Field of Classification Search
CPC ..... G06F 3/0644; G06F 3/0604; G06F 3/0679
USPC ........................................................ 711/154
See application file for complete search history.

(56) References Cited

U.S. PATENT DOCUMENTS

| 7,319,622 B1 | 1/2008 | Roy | |
| 2002/0079587 A1* | 6/2002 | Houston | H01L 23/528 257/774 |
| 2003/0046501 A1 | 3/2003 | Schulz et al. | |
| 2006/0171240 A1* | 8/2006 | Combe | G11C 16/24 365/230.06 |
| 2011/0066918 A1* | 3/2011 | Ramaraju | G06F 11/1012 714/E11.034 |

(Continued)

FOREIGN PATENT DOCUMENTS

WO 8905488 A2 6/1989

OTHER PUBLICATIONS

Baumann, Robert, "The Impact of Technology Scaling on Soft Error Rate Performance and Limits to the Efficacy of Error Correction", In Digest of the International Electron Devices Meeting, Dec. 8, 2002, pp. 329-332.

(Continued)

*Primary Examiner* — Gautam Sain
*Assistant Examiner* — Wei Ma
(74) *Attorney, Agent, or Firm* — Withrow & Terranova, PLLC (57) ABSTRACT

A memory array for storing odd and even data bits of data words in alternate sub-banks to reduce multi-bit error rate is disclosed. The memory array alternates odd data bits of a first plurality of data words in consecutive columns a first sub-bank of first and second memory banks and even data bits of the first plurality of data words in consecutive columns of a second sub-bank of the first and second memory banks. For example, the lowest bits of each of N data words are stored in a first N consecutive columns of a first sub-bank. The second bits of the N data words are stored in the next N consecutive columns of a second sub-bank. The N data bits in each of the bit positions of the N data words are interleaved in corresponding column mux sets. Alternating odd and even bits between sub-banks reduces multi-bit soft errors.

21 Claims, 6 Drawing Sheets

(56) References Cited

U.S. PATENT DOCUMENTS

2013/0262787 A1* 10/2013 Santhanam ....... H03M 13/2771
    711/E12.001
2021/0200630 A1* 7/2021 Ishikawa ............. G06F 11/1044

OTHER PUBLICATIONS

Hong, Jeongkyu et al., "Flexible ECC Management for Low-Cost Transient Error Protection of Last-Level Caches", In Journal of the IEEE Transactions on Very Large Scale Integration (VLSI) Systems, vol. 24, Issue 6, Jun. 2016, pp. 2152-2164.

Quach, Nhon, "High Availability and Reliability in the Itanium Processor", In Journal of the IEEE Micro, vol. 20, Issue 5, Sep. 2000, pp. 61-69.

"International Search Report and Written Opinion Issued in PCT Application No. PCT/US22/023210", dated Jul. 7, 2022, 10 Pages. (MS# 409522-WO-PCT).

* cited by examiner

MEMORY ARRAY FOR STORING ODD AND EVEN DATA BITS OF DATA WORDS IN ALTERNATE SUB-BANKS TO REDUCE MULTI-BIT ERROR RATE AND RELATED METHODS

FIELD OF THE DISCLOSURE

The technology of the disclosure relates to memory systems for storing digital data, and more particularly to memory array circuits configured to support storage of data in patterns that reduce instances of multiple-bit errors.

BACKGROUND

Memory arrays used in electronic devices compactly store large amounts of digital data that can be quickly accessed by a processing device. Memory arrays can be two-dimensional (2D) arrays (i.e., organized in memory rows and memory columns) of memory bitcell circuits ("memory bitcells") that store digital data bits. A memory row of memory bitcells in a memory array can store an entire data word, which is often 64, 128, or 256 bits in length, for example. There is an ongoing desire to increase the area density of a memory array. This objective is realized by technology improvements that reduce the area of a memory bitcell and the distances between memory bitcells in a memory row. As a result, a given area that can be affected by an incident high energy particle includes an increasing number of memory bitcells. Certain high energy particles incident on a memory array, known as a particle strike, can cause the states of memory bitcells within a given area to flip the state of stored data (e.g., from "0" to "1" or vice versa). If multiple memory bitcells storing data bits of a same data word are located within the area, one or more data bits of the data word can be affected. Thus, the number of multi-bit errors typically increases in a memory array as the density of memory bitcells in the memory array increase. If the data word is protected by an error correction code (ECC), a single bit error can be easily detected and corrected. An error in two or more data bits of a data word can also be detected, depending on the ECC scheme employed. However, correcting multiple bit errors may increase the amount of circuitry required for ECC and increase memory access time.

Figure 1:
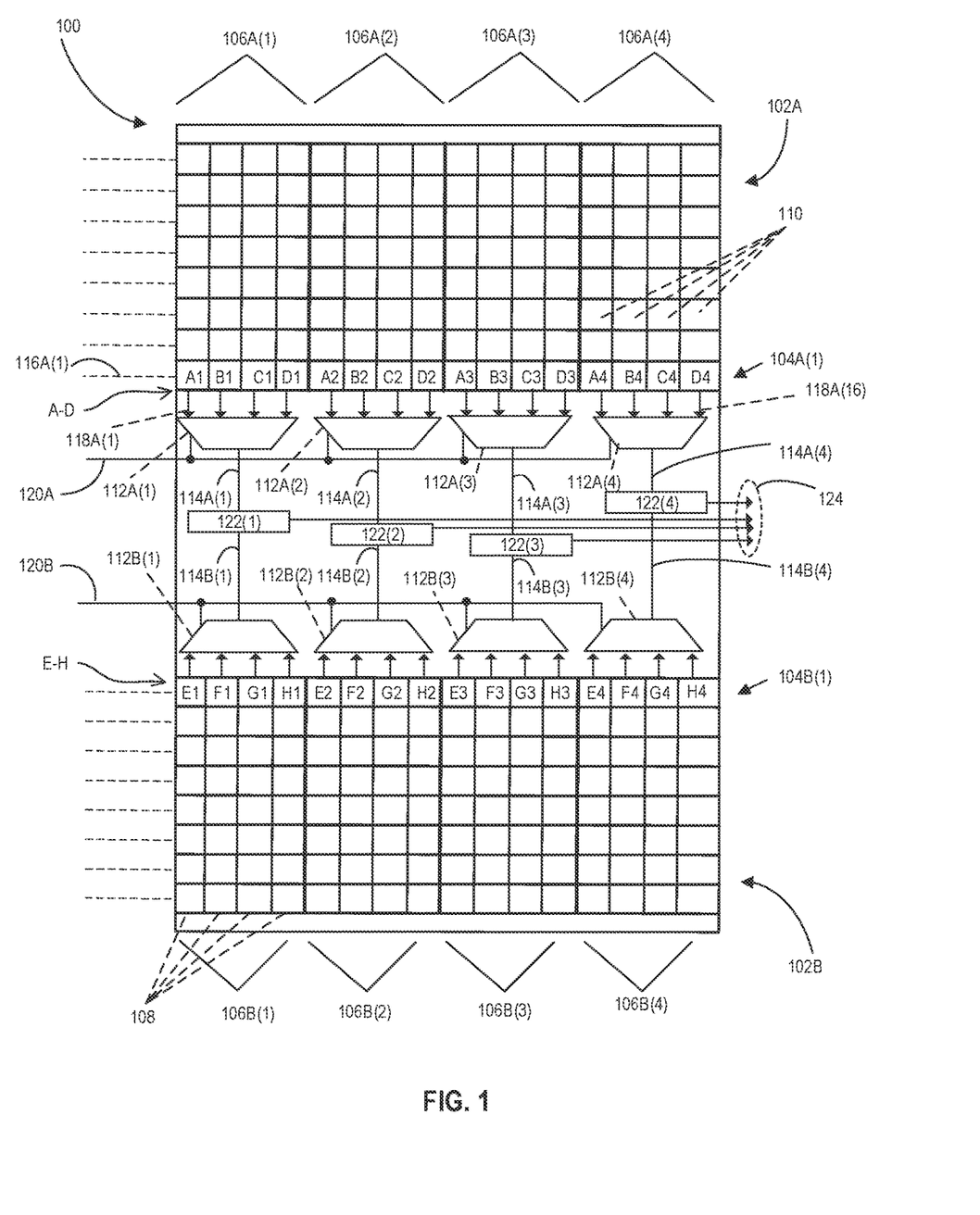
FIG. 1 is an illustration of a memory array circuit including two memory banks each including a conventional bank array circuit with column multiplexed (mux) data bits.

Column-multiplexing is a data storage scheme employed to reduce instances of multiple bit errors in a memory array 100. FIG. 1 illustrates a memory array 100 provided to illustrate column-multiplexing. The memory array 100 includes a first memory bank 102A and a second memory bank 102B. A first memory row 104A(1) in the first memory bank 102A is shown as storing data words A-D and the first memory row 104B(1) in the second memory bank 102B is shown as storing data words E-H. Each of the data words A-H has four data bits. The data bits A1-A4, B1-B4, C1-C4, and D1-D4 are interleaved such that bits of a data word are stored in every fourth memory bitcell. Multiple bit errors are reduced in the memory array 100 by distributing the data bits such that data bits A1 and A2, for example, are farther apart and less likely to have their memory states flipped by a high energy particle. Data bits A1-D1 are stored in a first column multiplexor (mux) sets 106A(1). The data bits A2'-D2, A3-D3, and A4-D4 are stored in column-mux sets 106A(2)-106A(4) in the first memory bank 102A. For example, the first bits of data words A-D (i.e., data bits A1, B1, C1, and D1) are stored in consecutive memory bit cell circuits 110 in the column mux set 106A(1). The data words E-H are store across column mux sets 106B(1)-106B(4) in the second memory bank 102B.

As an example, a particle strike centered on the memory bit cell circuit 110 storing the data bit C1 may cause an error in the state of data bit C1 and also cause errors in the memory states of data bits B1 and D1, on either side of data bit C1. In this situation, the particle strike would result in single bit errors in each of data words B-D but there would be no double bit errors. Interleaving corresponding data bits of four data words (e.g., A1-D1) in each of the column mux sets 106A(1)-106A(4), is known as CM4, which protects the memory array 100 from double bit errors unless a particle strike affects the memory states of more than four (4) consecutive memory bitcells 110 in a memory row, such as the memory rows 104A(1) or 104B(1).

The column mux sets 106A(1)-106A(4) include a corresponding mux 112A(1)-112A(4) and the column mux sets 106B(1)-106B(4) include corresponding muxes 112B(1)-112B(4). Data is read out of the first memory bank 102A on data outputs 114A(1)-114A(4), which are coupled to the outputs of the muxes 112A(1)-112A(4) and 112B(1)-112B(4). Data is read out of the second memory bank 102B on data outputs 114B(i)-114B(4), which are coupled to the outputs of the muxes 112B(1)-112B(4). Reading out the data word A, includes activating a wordline 116A(1) corresponding to the first memory row 104A(l) in the first memory bank 102A. This causes the values of all the memory bitcells 110 to be generated on the bitlines 118A(i)-118A(16), which are provided as inputs to the muxes 112A(1)-112A(4). The data bits A1-A4 are generated on the data outputs 114A(1)-114A(4) in response to activating a select line 120A to control each of the muxes 112A(1)-112A(4) to select the first input. The select line 120A can also be used to select one of the data words B-D. A select line 120B is used to generate one of the data words E-H on the data outputs 114B(1)-114B(4). The data outputs 114A(1)-114A(4) and data outputs 114B(1)-114B(4) are coupled to column circuits 122(1)-122(4), which select between the first memory bank 102A and the second memory bank 102B and generate a memory array output 124.

The data words stored in memory array 100 are only 4 bits in length for purposes of explanation. As noted above, a memory bank having column mux sets that are four columns wide protects against multiple bit errors if a particle strike affects only 4 data bits in a memory row, or less. However, a memory bank in which the column mux sets are four bits wide has memory rows that are four times longer than the length of a data word. Having such long memory rows significantly changes the profile of a memory array, which can negatively impact array characteristics and increase the difficulty of placing the memory array on a chip. As memory bitcell geometries decrease, more consecutive bits may be affected by the same particle strike. Protecting against multiple bit errors as shown in FIG. 1 would require increasing the number of columns in each column mux set, which further exacerbates problems that are based on the memory array profile.

SUMMARY

Exemplary aspects disclosed herein include memory arrays for storing odd and even data bits of data words in alternate sub-banks to reduce multi-bit error rate. Methods of reducing multi-bit errors in a column-multiplexed memory array are also disclosed. In an exemplary aspect, the memory array is configured to alternate odd bits of a first plurality of data words in odd columns of a first sub-bank of first and second memory banks and even bits of the first plurality of data words in even columns of a second sub-bank of the first and second memory banks. Alternating the odd/even bits of the data words in this manner reduces multi-bit soft errors. Each memory bank of a memory array includes a bank array circuit with memory bitcells disposed in columns and memory rows. A sub-bank of the bank array circuit includes a plurality of the memory rows. In one example, a number (N) of data words are stored in each memory row. In this example, data bits corresponding to the same bit position in each of the N data words are interleaved in columns to reduce multi-bit soft errors. For example, the lowest bits of each of the N data words are stored in the first N consecutive columns of the bank array circuit and the first N columns are included in a column multiplexor (mux) set. The data bits in each of the other bit positions of the N data words are interleaved in N consecutive columns and each of the N consecutive columns of the same bit position are coupled to a corresponding column mux set. The column mux set may include a mux for selecting one of the N data bits at each bit position. In this manner, data bits of a first data word are 2×N data bits apart in a memory row in the disclosed memory array, rather than N bits apart in a conventional column muxed memory array, virtually eliminating multi-bit soft errors.

In some examples, each memory bank comprises a first sub-bank that includes a first plurality of the memory rows and a second sub-bank that includes a second plurality of the memory rows. Each column of the bank array circuit comprises a first plurality of consecutive memory bitcells in the first plurality of memory rows and the first plurality of consecutive memory bitcells is coupled to a first sub-bank bitline. In some examples, each column of the bank array circuit comprises a second plurality of consecutive memory bitcells in the second plurality of memory rows and the second plurality of consecutive memory bitcells is coupled to a second sub-bank bitline. The first sub-bank bitline and the second sub-bank bitline are coupled to separate inputs of a corresponding column mux set. In this manner a number of loads is split between the first and second sub-bank bitlines to improve array access time.

In an exemplary aspect, a memory array circuit comprising a first memory bank and a second memory bank is disclosed. Each of the first memory bank and the second memory bank comprises a bank array circuit comprising memory bitcell circuits disposed in columns and memory rows. The bank array circuit further comprises at least one sub-bank comprising a plurality of memory rows. The bank array circuit also comprises a plurality of column mux sets, each comprising one or more consecutive columns of the columns, the plurality of column mux sets further comprising odd column mux sets alternately disposed with even column mux sets. A first memory row of a first sub-bank of the at least one sub-bank of the bank array circuit in a first selected bank among the first memory bank and the second memory bank is configured to store odd data bits of at least a first data word in the memory bitcell circuits in the one or more consecutive columns of each of the odd column mux sets of the first selected bank. A first memory row of a second sub-bank of the at least one sub-bank in the bank array circuit in a second selected bank among the first memory bank and the second memory bank is configured to store even data bits of the first data word of the at least a first data word in the memory bitcell circuits in the one or more consecutive columns of each of the even column mux sets of the second selected bank.

In another exemplary aspect, a method in a memory array circuit is disclosed. The method comprises activating a first wordline in a first memory row of memory bitcell circuits in a first sub-bank of at least one sub-bank of a first selected bank of a first memory bank and a second memory bank of a memory array circuit to generate first data bits stored in the first memory row onto first sub-bank bitlines, the first data bits comprising odd data bits of at least a first data word. The method comprises activating a second wordline in a second memory row of memory bitcell circuits in a second sub-bank of at least one sub-bank of a second selected bank of the first memory bank and the second memory bank of the memory array circuit to generate second data bits stored in the second memory row onto second sub-bank bitlines, the second data bits comprising even data bits of the at least a first data word. The method further comprises controlling a first select line to control multiplexors coupled to the first sub-bank bitlines to generate the odd data bits of the first data word on first odd data outputs of the memory array circuit, and control multiplexors coupled to the second sub-bank bitlines to generate the even data bits of the first data word onto first even data outputs of the memory array circuit.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Exemplary aspects disclosed herein include memory arrays for storing odd and even data bits of data words in alternate sub-banks for reduced multi-bit error rate. Methods of reducing multi-bit errors in a column-multiplexed memory array are also disclosed. In an exemplary aspect, the memory array is configured to alternate storage of odd bits of a first plurality of data words in odd columns of a first sub-bank among first and second memory banks and even bits of the first plurality of data words in even columns of a second sub-bank among the first and second memory banks. Alternating the odd/even bits of the data words in this manner reduces multi-bit soft errors. Each memory bank of a memory array includes a bank array circuit with memory bitcells disposed in columns and memory rows. A sub-bank of the bank array circuit includes a plurality of the memory rows. In one example, a number (N) of data words are stored in each memory row. In this example, data bits corresponding to the same bit position in each of the N data words are interleaved in columns to reduce multi-bit soft errors. For example, the lowest bits of each of the N data words are stored in the first N consecutive columns of the bank array circuit and the first N columns are included in a column multiplexor (mux) set. The data bits in each of the other bit positions of the N data words are interleaved in N consecutive columns and each of the N consecutive columns of the same bit position are coupled to a corresponding column mux set. The column mux set may include a mux for selecting one of the N data bits at each bit position. In this manner, data bits of a first data word are 2×N data bits apart in a memory row in the disclosed memory array, rather than N bits apart in a conventional column muxed memory array, virtually eliminating multi-bit soft errors.

In some examples, each memory bank comprises a first sub-bank that includes a first plurality of the memory rows and a second sub-bank that includes a second plurality of the memory rows. Each column of the bank array circuit comprises a first plurality of consecutive memory bitcells in the first plurality of memory rows and the first plurality of consecutive memory bitcells is coupled to a first sub-bank bitline. In some examples, each column of the bank array circuit comprises a second plurality of consecutive memory bitcells in the second plurality of memory rows and the second plurality of consecutive memory bitcells is coupled to a second sub-bank bitline. The first sub-bank bitline and the second sub-bank bitline are coupled to separate inputs of a corresponding column mux set. In this manner a number of loads is split between the first and second sub-bank bitlines to improve array access time.

Failure-In-Time (FIT) rate of a memory array is a measure of how often a single bit or multi-bit error is detected in the data that is read out of a memory array. The FIT rate is predominantly based on the Soft-Error Rate (SER). Soft errors occur when high-energy particles (e.g., neutrons and alpha particles) strike an area of a memory array. A memory array stores digital (e.g., binary) data bits in a two-dimensional array of memory bitcell circuits ("memory bitcells") that are arranged in memory rows and columns. A high-energy particle strike can affect the logic states of the data bits in all the memory bitcells within the area. As technology advances and memory bitcells get smaller, the number of data bits that can be affected by a high-energy particle strike increases. Current efforts to address this problem include error-correction codes (ECC) and column multiplexing ("column muxing"), also known as column interleaving. Using ECC, it is possible to detect and correct a single bit error with a relatively small amount of logic and do so in a relatively small amount of time. Double bit errors can also be detected and corrected but the cost for doing so is a significant increase in logic circuits, which increases the area of the memory array, increases the power consumption of the memory array, and increases the access time of the memory array.

Column-muxing is a method of reducing the number of multiple bit errors. By interleaving data bits of different data words with each other in consecutive memory bitcells in a memory row, the effect of a high-energy particle strike is single bit errors on multiple data words, as opposed to multiple data bit errors in a single data word. A limitation of column-muxing is that interleaving increases the length of the memory rows in the memory array to include multiple interleaved data words. Currently column-muxing four columns (CM4) requires the memory rows of a memory array to be long enough to hold four data words. Longer memory rows change the form factor (e.g., profile) of a memory array, which can affect placement and routing options as well as power consumption and timing in an integrated circuit (IC) in which the memory array is employed. However, as memory bitcells get smaller, CM4 may not be sufficient to avoid multi-bit errors. CM8, column-muxing eight columns, may be considered for keeping the SER or FIT rate low, but implementing CM8 would double the memory row length of a memory array compared to CM4, which could lead to a problematic form factor for an IC.

Figure 2:
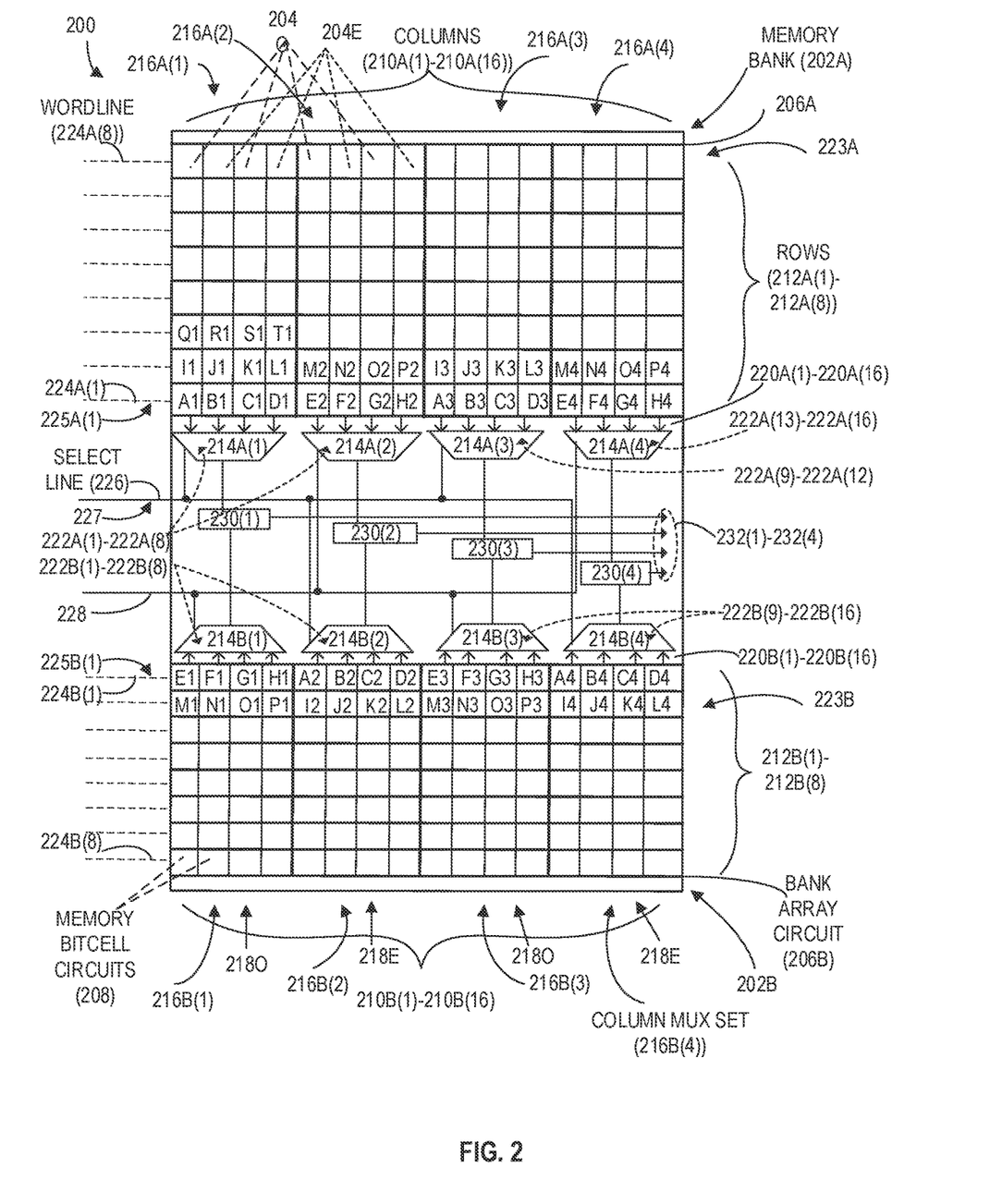
FIG. 2 is a diagram illustrating an exemplary memory array circuit including first and second memory banks each including a bank array circuit with one or more consecutive columns of a first memory bank coupled to each odd column mux set of the first memory bank and one or more consecutive columns of a second memory bank coupled to each even column mux set of the second memory bank.

An exemplary memory array circuit 200, illustrated in FIG. 2, includes a first memory bank 202A and a second memory bank 202B. The memory array circuit 200 employs column muxing and alternates storage of odd data bits 204O and even data bits 204E between the first memory bank 202A and the second memory bank 202B to increase multi-bit error protection with reduced impact on power, performance, timing, and area. The memory banks 202A and 202B include bank array circuits 206A and 206B, respectively, formed of memory bitcell circuits ("memory bitcells") 208. The first and second memory banks 202A and 2021B are separate arrays that each provide a respective portion (e.g., half) of the storage of the memory array circuit 200 to reduce problems of using a single, larger array. The memory bitcells 208 are formed of semiconductor transistors interconnected by wires or traces. The memory bitcells 208 may be static random-access memory (SRAM) bit cell circuits, such as six transistor (6T), eight transistor (8T), or ten transistor (10T) SRAM bitcells formed of silicon, as non-limiting examples. The memory array circuit 200 are not limited to SRAM bitcells and may include other types of memory bitcells. The memory array circuit 200, and other memory array circuits disclosed herein, may be disposed on substrates and in integrated circuits, for example.

The bank array circuit 206A and the bank array circuit 206B are equivalent structures. Thus, descriptions of bank array circuit 206A herein are also descriptive of bank array circuit 206B. The memory bitcells 208 in the bank array circuit 206A are arranged in columns 210A(1)-210A(16) and memory rows 212A(1)-212A(8). The memory bitcells 208 in the bank array circuit 206B are arranged in columns 210B(1)-210B(16) and memory rows 212B(1)-212B(8). A memory circuit corresponding to the memory array circuit 200 can have any number of columns that may be determined by a number of data words and a number of bits in each data word, including parity or ECC bits, such as 288 columns, for example. A memory array circuit corresponding to the memory array circuit 200 can have any number of memory rows, such as 256, depending on a desired array capacity.

Data stored in the memory array circuit 200 is retrieved from memory bitcells 208 therein in a read operation, which is described in below following a detailed description of the organization of the columns 210A(1)-210A(16), the data stored in the memory bitcells 208 in each column, and the other features used to perform the read operation in the memory array circuit 200.

In an exemplary aspect, data words A-H are stored in first rows 212A(1) and 212B(1). The data bits A1-D1 are referred to herein as corresponding bits of the data words A, B, C, and D because they all correspond to the same bit positions (i.e., first bit position) within the data words A-D. Odd data bits 204O of data words A-D and even data bits 204E of data words E-H are stored in the first memory row 212A(i) of the first bank array circuit 206A. Even data bits (204E) of data words E-H and odd data bits (204O) of data words A-D are stored in the first memory row 212B(1) of the first bank array circuit 206B. Data words A-D include the bits A1-A4, B1-B4, C1-C4, and D1-D4, respectively. Data bits A1-D1 and A3-D3, in the first and third bit positions, respectively, of the data words A, B, C, and D, are referred to herein as odd data bits 204O. Data bits A2-D2 and A4-D4, in the second and fourth bit positions, respectively, and are referred to herein as even data bits 204E.

The columns 210A(1)-210A(4), for example, are referred to as odd columns 210O because odd data bits (204O) are stored therein. The columns 210A(5)-210A(8) are referred to as even columns 210E in which even data bits (204E) are stored. The columns 210A(1)-210A(4) (odd columns 210O) of bank array circuit 206A are coupled to a mux 214(1) to form a column mux set 216A(1). The column mux set 216A(1) is used to read out data stored in any of the memory bitcells 208 in the columns 210A(1)-210A(4). The column mux set 216A(1) coupled to odd columns 210O is referred to as an odd column mux set 218O. The column mux sets 216A(3), 216B(1), and 216B(3) are also referred to as odd column mux sets 218O because they are coupled to odd columns 210O. The column mux sets 216A(2), 216A(4), 216B(2), and 216B(4) are even column mux sets 218E because they are coupled to even columns 210E. Thus, in the memory array circuit 200, the odd columns 210AO and 210BO are each coupled to an odd column mux set 218O and the even columns 210AE and 210BE are each coupled to an even column mux set 218E.

As noted above, an exemplary aspect of the memory array circuit 200 is that, rather than storing all the data bits A1-A4 of the data word A in a same memory row 212A(1) of the first memory batik 202A of the memory array circuit 200, the first data bit A1 and the third data bit A3 of the data word A (odd data bits 204O) are stored in the first memory bank 202A and the second and fourth data bits A2 and A4 are stored in the second memory bank 102B. The bits A1 and A3 are stored in memory bitcells 208 in odd columns 210O coupled to the first column mux set 216A(1) and the third column mux set 216A(3), respectively, of the first memory bank 202A. The second data bit A2 and the fourth data bit A4 (even data bits 2014E) are stored in memory bitcells 208 in even columns 210E coupled to the second column mux set 216B(2) and the fourth column mux set 216B(4), respectively, of the second memory bank 202B.

In the memory array circuit 200 in FIG. 2, odd columns 210O corresponding to bits A1-D1 are coupled to the column mux set 216A(1) as an example. In other examples, the memory row 212A(1) may store data bits of one or more data words up to, for example, thirty-two (32) data words. Thus, at least one odd column 210O is coupled to each of the odd column mux sets 218O and at least one even column 210E is coupled to each of the even column mux sets 218E.

The data words E-H are also stored in the first memory row 212A(1) of the first bank array circuit 206A and the first memory row 212B(1) of the second bank array circuit 206A. For example, the first data bit E1 and the third data bit E3 of the data word E are stored in odd columns 210O coupled to the first column mux set 216B(1) and the third column mux set 216B(3), respectively. The second data bit E2 and the fourth data bit E4 are stored in even columns 210E coupled to the second column mux set 216A(2) and the fourth column mux set 216A(4), respectively.

Stated differently, the first memory row 212A(1) of the bank array circuit 206A in the first memory bank 202A stores, in the memory bitcells 208, odd data bits 204O of the data words A-D in columns 210A(1)-210A(4) and 210A(9)-210A(12), which correspond to the odd column mux sets 216A(1) and 216A(3). The first memory row 212B(1) of the bank array circuit 206B in the second memory bank 202B stores the even data bits 2204E of the data word A-D in the columns 210B(5) and 210B(13) corresponding to the even column mux sets 216B(2) and 216B(4). The first memory row 212A(1) of the bank array circuit 206A in the first memory bank 202A stores, in the memory bitcells 208 in columns 210A(5)-210A(8) and 210A(13)-210A(16) coupled to the even column mux sets 216A(2) and 216A(4), respectively, even data bits 204E (E2-H2 and E4-H4) of the data word E-H. The first memory row 212B(1) of the bank array circuit 206B in the second memory bank 202B stores, in the memory bitcells 208 in columns 210B(1)-210B(4) and 210B(9)-210B(12) coupled to the odd column mux sets 216B(1) and 216B(3), respectively, the odd data bits 204O (E1-H1 and E3-H3) of the data words E-H.

The second memory row 212A(2) of the bank array circuit 206A stores odd data bits I1-L1 in columns 210A(1)-210A(4) in the odd column mux set 216A(1)), and stores data bits M2-P2 in columns 210A(5)-210A(8) in the even column mux set 216A(2)). Specifically, the second memory row 212A(2) of the bank array circuit 206A stores, in odd columns 210A(1) and 210A(9) coupled to the odd column mux sets 216A(1) and 216A(3), respectively, odd data bits 204O of the data word I and the second memory row 212B(2) of the bank array circuit 206B stores, in even columns 210B(5) and 210B(13) coupled to the even column mux sets 216B(2) and 216B(4), respectively, the even data bits 204E of the data word I. Similarly, data bits Q1-T1 of data words (e.g., Q-T) are stored in the memory row 212A(3) in odd columns 210A(1)-210A(4) included in the odd column mux set 216A(1).

Advantages of the memory array circuit 200 are described with respect to the data bit A. Another data bit of the data word A that is nearest to A1 in column 210A(1) in the first memory bank 202A is the data bit A3 in column 210A(9). Data bits B1-D1 and E2-H2 separate the data bit A1 and the data bit A3 in the memory row 212A(1). In this example, data bit A3 is eight columns away from data bit A1 in the first memory row 212A(1), which provides higher protection against soft errors than column muxing alone. Thus, column muxing combined with the exemplary aspect of alternating storage of odd data bits 204O and even data bits 204E between the first memory bank 202A and the second memory bank 202B increases separation of the data bits A1-A4 of the data word A. Thus, it becomes less likely that more than one bit of the data bits A1-A4 would be affected by a single incident high-energy particle. The data bits A1 and A3 in the first memory bank 202A are protected to a similar extent as a memory array circuit employing CM8 column muxing with all the data bits of eight data words in a same row, which would result in the memory rows being twice as long as in memory array circuit 200.

The columns 210A(1)-210A(16) also include bitlines 220A(1)-220A(16). The bitline 220A(1) is coupled to all of the memory bitcells 208 in the column 210A(1). In other words, in each of the columns 210A(1)-210A(16), the corresponding bitlines 220A(1)-220A(16) are coupled to the memory bitcells 208 in each of the memory rows 212A(1)-212A(8). In this regard, the bank array circuit 206A comprises a single sub-bank 223A and the bank array circuit 206B comprises a single sub-bank 223B. The bitlines 220A(1)-220A(4) are also referred to as sub-bank bitlines 220A(1)-220A(4) of the sub-banks 223A and 223B. The bitlines 220A(1)-220A(4) are coupled to mux inputs 222A(1)-222A(4) of the muxes 214A(1)-214A(4).

The memory rows 212A(1)-212A(8) of the bank array circuit 206A also include wordlines 224A(1)-224A(8) coupled to the memory bitcells 208 therein. As an example, the wordline 224A(l) is coupled to all of the memory bitcells 208 in the memory row 212A(1). Reading out one of the data words A-H from the first memory row 212A(1) includes activating the wordline 224A(1). Activating the wordline 224A(1) includes generating a digital signal 225A(1) on the wordline 224A(1) to control generation of the data bits A1-D1, E2-H2, A3-D3, and E4-H4 onto the bitlines 220A(1)-220A(16). Similarly, the states of all the data bits E1-H1, A2-D2, E3-H3 and A4-D4 are generated on the bitlines 220B(1)-220A(16), respectively, in response to activating the wordline 224B(1), which includes generating a digital signal 225B(1) on the wordline 224B(1). When reading out the data word A, as an example, activating the wordline 224A(1) in this manner provides the data bits A1 and A3, respectively, to the muxes 214A(1) and 214A(3). Reading out the data word A also includes activation of the wordline 224B(1) to generate the data bits A2 and A4, respectively, on the bitlines 220B(5)-220B(13) coupled to the muxes 214B(2) and 214B(4).

The memory array circuit 200 also includes select lines 226 and 228 to control which of the data words A-H are read out through the muxes 214A(1)-214A(4) and 214B(1)-214B(4). The select line 226 is coupled to the muxes 214A(1) and 214A(3) of the odd column mux sets 218O of the bank array circuit 206A. The select line 226 selects the data bits A1 and A3, respectively, on the mux inputs 222A(1) and 222A(9) to be provided to column circuits 230(1) and 230(3). The select line 226 is also coupled to the muxes 214B(2) and 214B(4) of the even column mux sets 218E of the bank array circuit 206B and selects the data bits A2 and A4 on the mux inputs 222B(5) and 222B(13) to be provided to column circuits 230(2) and 230(4). A digital signal 227 is generated on the select line 226 to select an input corresponding to one of the desired data words A-D. The data bits A1-A4 are generated on the data outputs 232(1)-232(4) of the column circuits 230(1)-230(4). Data outputs 232(1) and 232(3) may also be referred to as odd data outputs 232(1) and 232(3). Data outputs 232(2) and 232(4) may also be referred to as even data outputs 232(2) and 232(4).

The select line 228 is coupled to the muxes 214B(1) and 214B(3) of the odd column mux sets 218O of the bank array circuit 206B and to the muxes 214A(2) and 214A(4) of the even column mux sets 218E of the bank array circuit 206A. A digital signal 229 is generated on the select line 228 when reading out any of the data words E-H from the memory array circuit 200. As an example, when reading out the data word E, the data bits E1-E4 are generated on the second odd data outputs 232(1) and 232(3) and on the second even data outputs 232(2) and 232(4).

The data bits A1-A4 are provided to the mux inputs 222A(1). 222B(5), 222A(9), and 222B(13), which are in the same bit positions of the respective muxes 214A(1), 214B(2), 214A(3), and 214B(4). Thus, the digital signal 227 generated on the select lines 226 causes the muxes 214A(1), 214B(2), 214A(3), and 214B(4) to provide the data bits A1-A4 to the column circuits 230(1)-230(4). Similarly, the data bits E1-E4 are coupled to the same relative positions of the muxes 214B(1), 214A(2), 214B(3), and 214A(4) and the digital signal 229 generated on the select line 228 selects the data bits E1-E4 to be provided to the column circuits 230(1)-230(4).

The access time for reading the data word A from the memory array circuit 200 is determined, in part, by a capacitance of the bitlines 220A(1)-220A(16) and 220B(1)-220B(16). Capacitance of the bitline 220A(1), for example, depends on a number of the memory bitcells 208 to which the bitline 220A(1) is coupled. In the example in FIG. 2, the memory array circuit 200 includes only eight memory rows 212A(1)-212A(8) but this is just an example used for purposes of explanation. A memory array circuit in an IC may have any number, up to hundreds or more of memory rows, for example, meaning that the bitlines in each column couple to hundreds or more of the memory bitcells 208. The capacitance of a bitline increases with the number of memory bitcells 208 coupled to the bitline.

Figure 3:
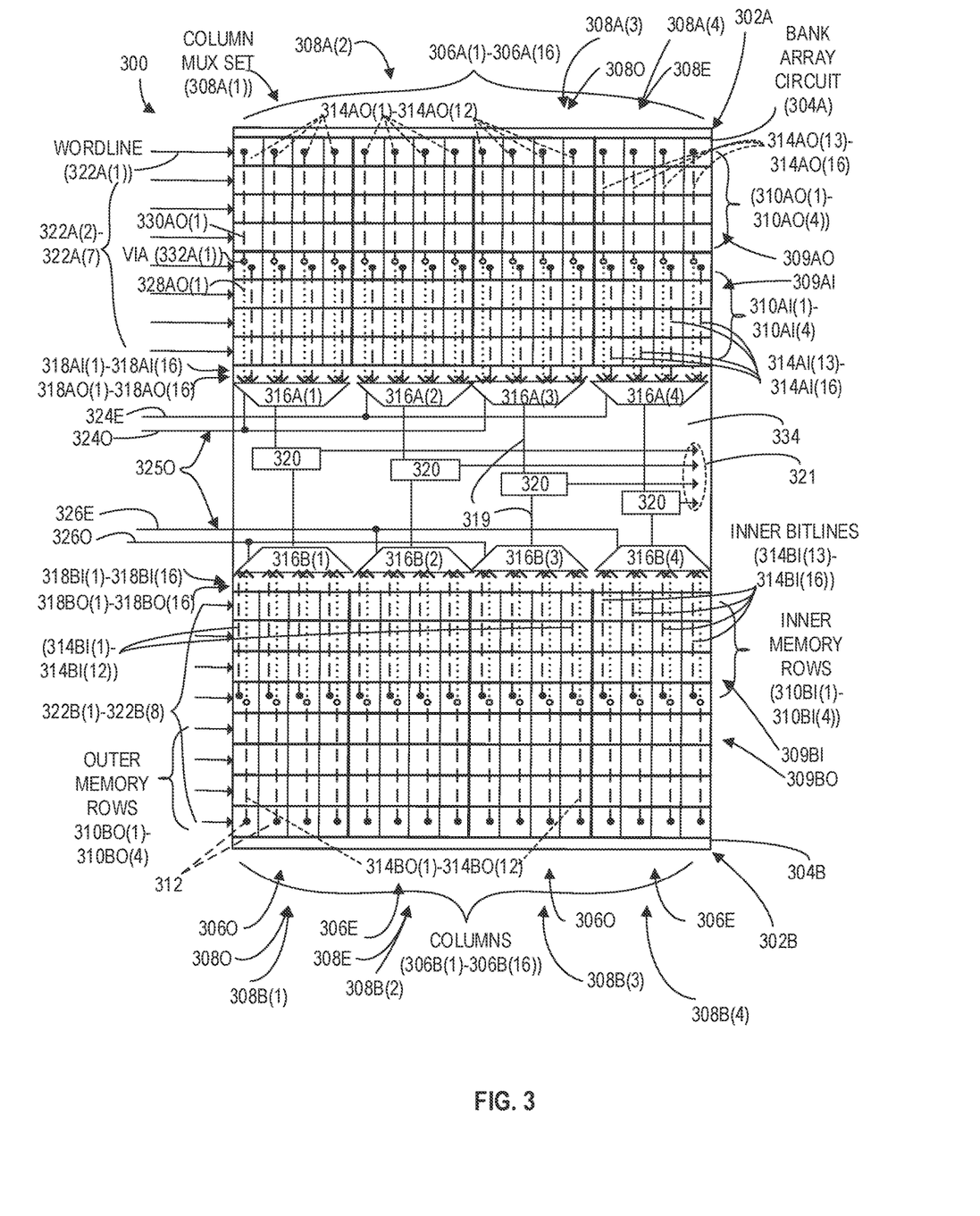
FIG. 3 is a diagram illustrating an example of the memory array circuit in FIG. 2 in which each bank array circuit includes an inner sub-bank including the inner memory rows with memory bitcell circuits in each column coupled to an inner sub-bank bitline and an outer sub-bank including the outer rows with memory bitcell circuits in each column coupled to an outer sub-bank bitline.

The exemplary memory array circuit 300 illustrated in FIG. 3 includes aspects disclosed above and further includes features for reducing bitline capacitance with the benefit of improving access time compared to the memory array circuit 200 in FIG. 2. Other than the aspects described below, the memory array circuit 300 is configured to operate as described above with regard to the memory array circuit 200 in FIG. 2.

The memory array circuit 300 includes first and second memory banks 302A and 302B which include bank array circuits 304A and 304B. The bank array circuit 304A includes columns 306A(1)-306A(16) that are grouped into column mux sets 308A(1)-308A(4). The columns 306A(1)-306A(4) and 306A(9)-306A(12) are also referred to as odd columns 306O because the data bits A1-D1 and A3-D3 are stored therein. The columns 306A(5)-306A(8) and 306A(13)-306A(16) are also referred to as even columns 306E because the data bits E2-12 and E4-H4 are stored therein. The column mux sets 308A(1)-308A(4) include odd column mux sets 308O (e.g., 308A(1) and 308A(3)) and even column mux sets 308E (e.g., 308A(2) and 308A(4)). The bank array circuit 304B also includes odd mux sets 308O and even mux sets 308E. The odd column mux sets 308O include odd columns 306O and the even column mux sets 308E include even columns 306E.

Referring back to FIG. 2, all the memory bitcells 208 in the column 210A(1) are coupled to the sub-bank bitline 220A(1) just as the sub-bank bitlines 220A(2)-220A(16) are coupled to all the memory bitcells 208 in their respective columns 210A(2)-210A(16). Thus, all of the memory rows 212A(1)-212A(8) in the bank array circuit 206A are included in the same sub-bank 223A. The bank array circuit 206B also includes all the memory rows 210B(1)-210B(8) in the sub-bank 223B.

The bank array circuit 304A differs from the bank array circuit 206A in FIG. 2 at least because, rather than having a single sub-bank, the bank array circuit 3014A is logically divided into an inner sub-bank 309AI including inner memory rows 310AI(1)-310AI(4) and an outer sub-bank 309AO that includes outer memory rows 310AO(1)-310AO(4). The inner memory rows 310AI(1)-310AI(4) include a first plurality of memory bitcells 312 disposed in the columns 306A(1)-306A(16) of the column mux sets 308(1)-308(4). The outer memory rows 310AO(1)-310AO(4) include a second plurality of the memory bitcells 312 in the columns 306A(1)-306A(16) of the column mux sets 308(1)-308(4). The first plurality of memory bitcells 312 in the columns 306A(1)-306A(16) are coupled to inner sub-bank bitlines 314AI(1)-314AI(16). The columns 306A(1)-306A(16) in the outer sub-bank 309AO include outer sub-bank bitlines 314AO(1)-314AO(16) coupled to the second plurality of the memory bitcells 312 in the outer memory rows 310AO(1)-310AO(4)). The outer sub-bank bitlines 314AO(1)-314AO(16) are also included in the corresponding column mux sets 308A(1)-308A(4). Each of the column mux sets (e.g., 308A(1)) includes one or more consecutive columns (e.g., 306A(1)-306A(4)) and bank array circuit 304A includes odd column mux sets 308O alternating with even column mux sets 308E.

The bank array circuit 304A also includes muxes 316A(1)-316A(4) corresponding to the column mux sets 308A(1)-308A(4). The memory bank 304B also includes muxes 316B(1)-316B(4) corresponding to the column mux sets 308B(1)-308B(4). The mux 316A(1), as an example, includes inner mux inputs 318AI(1)-318AI(4) coupled to the inner sub-bank bitlines 314AI(1)-314AI(4) and outer mux inputs 318AO(1)-318AO(4) coupled to the outer sub-bank bitlines 314AO(1)-314AO(4). The muxes 316A(2)-316A(4) are similarly coupled to the inner sub-bank bitlines 314AI(5)-314AI(16) of the sub-bank 309AI, and to the outer sub-bank bitlines 314AO(5)-314AO(16) of the sub-bank 309AO. The muxes 316A(1)-316A(4) and 316B(1)-316B(4) include mux outputs 319 coupled to column circuits 320, which generate array outputs 321.

It should be understood that, in the example described in FIG. 3, the data words A-H are stored in the inner memory row 310AI(1) in the sub-bank 309AI and the inner memory row 310BI(1) in the sub-bank 309BI. The data words A-H are not shown in FIG. 3 to avoid congestion. The bank array circuit 304A includes wordlines 322A(1)-322A(8) and the bank array circuit 304B includes wordlines 322B(1)-322B(8). A read operation of the data word A includes activating the wordline 322A(1) to generate the data bits A1-D1 on the inner sub-bank bitlines 314AI(1)-314AI(4) in the columns 306A(1)-306A(4) of the column mux set 308A(1) and the data bits A3-D3 on the inner sub-bank bitlines 314AI(9)-314AI(12) in the columns 306A(9)-306A(12) in the column mux sets 308A(3). Activating the wordline 322B(1) generates the data bits A2-D2 on the inner sub-bank bitlines 314BI(5)-314BI(9) in the column 306B(5)-306B(9) of the column mux set 3081B(2) and data bits A4-D4 on the inner sub-bank bitlines 314BI(13)-31413(16) in the columns 306B(13)-306B(16) in the column mux sets 308B(4). It should be understood that activating the wordlines 322A(1) and 322B(1) also generate the data bits of data words E-H to the muxes 316B(1), 316A(2), 316B(3), and 316A(4), respectively, but the mux outputs 319 corresponding to the data words E-H are not selected by the column circuits 320 for generation on the array outputs 321 in a read operation of the data words A, B, C, or D.

The example in FIG. 3 includes four data words A-D stored in the inner memory row 310AI(1) of the inner sub-bank 309AI in the first memory bank 302A, which is a first selected bank among the first memory bank 302A and the second memory bank 302B. The odd columns 306O (i.e., columns 306A(1)-306A(4)) are consecutive odd columns 306O included in the odd column mux set 308A(1). In other examples, there may be one or more odd column 306O in each odd column mux set and one or more even column 306E in each even column mux set 308E. Examples include between one (1) and thirty-two (32) or more consecutive odd columns 306O in an odd column mux set 308O and between 1 and 32 consecutive even columns 306E in an even column mux set 308E. In this example, in the first sub-bank (e.g., 309AI) of the first selected bank (e.g., 302A), the odd data bits (e.g., A1 and A3) of a data word A may be stored in the memory bitcells 312 in one of the one or more consecutive odd columns 306O of an odd column mux set 308O. In the memory row 310BI(1) of the sub-bank 309BI of a second selected bank of the first and second memory banks 302A and 302B, the even data bits (e.g., A2 and A4) of the data word A may be stored in a memory bitcell 312 in one of the one or more consecutive even columns 306E of an even column mux set 308E. Alternatively, the even data bits A2 and A4 of the data word A may be stored in one of the memory rows 310AO(1)-310AO(4) of the sub-bank 309AO in the memory bank 302A or in one of the memory row 310BO(1)-310BO(4) of the sub-bank 309BO in the memory bank 302B.

In other words, one of the memory rows 310AI(1)-310AI(4) of the sub-bank 309AI in the memory bank 302A is configured to store odd data A1-D1 and A3-D3 of the data words A-D in the one or more consecutive columns 306AI(1)-306AI(4) of the first selected bank (302A). In addition, one of the memory rows (e.g., 310AO(1)-310AO(4), 310BI(1)-310BI(4), or 310BO(1)-310BO(4)) of a second sub-bank (e.g., 309AO, 309BI, 309BO) in the bank array circuit (304A or 304B) in a second selected bank of the memory bank 302A and the memory bank 302B is configured to store even data bits A2-D2 and A4-D4 of the data word A in the memory bitcells 312 in one or more consecutive columns (e.g., 306BI(5)-306BI(8)) of each of the even column mux sets 308E in the second selected bank (302A or 302B).

The memory array circuit 300 includes select lines 324E, 324O, 326E, and 326O. The select lines 324O, also referred to as an odd select line 324O in the bank array circuit 304A, is coupled to and controls the muxes 316A(1) and 316A(3) of odd column mux sets 308O. The odd select line 324O controls the muxes 316A(1) and 316A(3) to select the inner sub-bank bitline 314AI(1) in the column 306A(1) and the inner sub-bank bitline 314AI(9) in the column 306A(9). The select line 324E, also referred to as even select line 324E in the bank array circuit 304A is coupled to the muxes 316A(2) and 316A(4) of even column mux sets 308E. The select line 324E controls the muxes 316A(2) and 316A(4) to select the inner sub-bank bitline 314AI(5) in the column 306A(5) in the column mux set 308A(2) and select the inner sub-bank bitline 314AI(13) in the column 306A(13) in the column mux set 308A(4). The select line 326E, referred to as an even select line 3246E, is coupled to the muxes 316B(2) and 316B(4) of even column mux sets 308E. The select line 326O, also referred to as odd select line 326O is coupled to the muxes 316B(1) and 316B(3) of odd column mux sets 308O. The even and odd sub-bank select lines 326E and 326O control the even and odd column mux sets 308A(1)-308A(4).

In this manner, the odd select line 324O and the even select line 326E are activated to read out the data word A. The select lines 324O and 326E can also be used to select the data bits of any of the data words B-D. Similarly, the select line 324E and 326O can be activated to read out the data bits of any of the data words E-H. In this context, as an example, activating the select lines 324O and 326E includes generating a digital signal 325O to control the muxes 316A(1) and 316A(3) and the muxes 316B(3) and 316B(4) to select a desired input. Similar signals are generated on the select lines 324E and 326O.

To read out a data word stored in the outer memory rows 310AO(1) and 310BO(1), the wordlines 322A(5) and 322B (5) are activated. The select lines 324O and 326E are activated to control the muxes 316A(1) and 316A(3) of the bank array circuit 304A and the muxes 316B(2) and 316B(4) of the bank array circuit 304B to select the desired data word, or the select lines 324E and 326O are activated to control the muxes 316A(2) and 316A(4) of the bank array circuit 304A and the muxes 316B(1) and 316B(3) of the bank array circuit 304B.

In the memory array circuit 300, the inner sub-bank bitlines 314AI(1)-314AI(16) each include a metal line, wire, or trace in a first metal layer Mx, which may be metal layer M1 of an integrated circuit. The inner sub-bank bitline 314AI(1) is coupled to all of the first plurality of the memory bitcells 312 in the inner memory rows 310AI(1)-310AI(4) in the columns 306A(1)-306A(16).

The outer sub-bank bitlines 314AO(1)-314AO(16) each include a first outer sub-bank bitline section 328AO(1) and a second outer sub-bank bitline section 330AO(1). The first outer sub-bank bitline section 328AO(1) is a metal line, wire or trace in the first metal layer Mx (not shown). The first outer sub-bank bitline section 328AO(1) is coupled to all of the second plurality of the memory bitcells 312 in the outer memory rows 310AO(1)-310AO(4) in the columns 306A (1)-306A(16). The second outer sub-bank bitline section 330AO(I) is a metal line, wire or trace in a second metal layer Mz (not shown). The second metal layer Mz may be an M2 or M3 layer, for example, of an IC, but is not limited in this regard. The second outer sub-bank bitline section 330AO(1) is coupled to the first outer sub-bank bitline section 328AO(1) by a vertical interconnect access (via) 332A(1). The via 332A(1) extends vertically between the first metal layer Mx and the second metal layer Mz.

As shown in FIGS. 2 and 3, the first memory bank 302A and the second memory bank 302B are separated from each other. The muxes 316A(1)-316A(4) and 316B(1)-316B(4) are disposed in a middle area 334 of the memory array circuit 300 between the inner memory rows 310AI(1)-310AI (4) of the first memory bank 302A and the inner memory rows 310BI(1)-310BI(4) of the second memory bank 302B. The inner memory rows 310A(1)-(4) and the inner memory rows 310B(1)-310B(4) are "inner memory rows" because they are closer to the middle area 334. The outer memory rows 310AO(1)-310AO(4) and 310BO(1)-310BO(4) are "outer memory rows" because they are farther from the middle area, on the outsides of the memory banks 206A and 206B. In an example, the columns 306A(1)-306A(16) can be collinear with the columns 306B(1)-306B(16), respectively. The inner memory rows 310AI(1)-310AI(4) are on a first side in a first direction of the first memory bank 302A and the outer memory rows 310AO(1)-310AO(4) are on a second side in the first direction of the first memory bank 302A. The inner memory rows 310BI(1)-310BI(4) are on the second side in the first direction of the second memory bank 302B and the outer memory rows 310AO(1)-310AO(4) are on the first side in the first direction of the second memory bank 302B.

Figure 4:
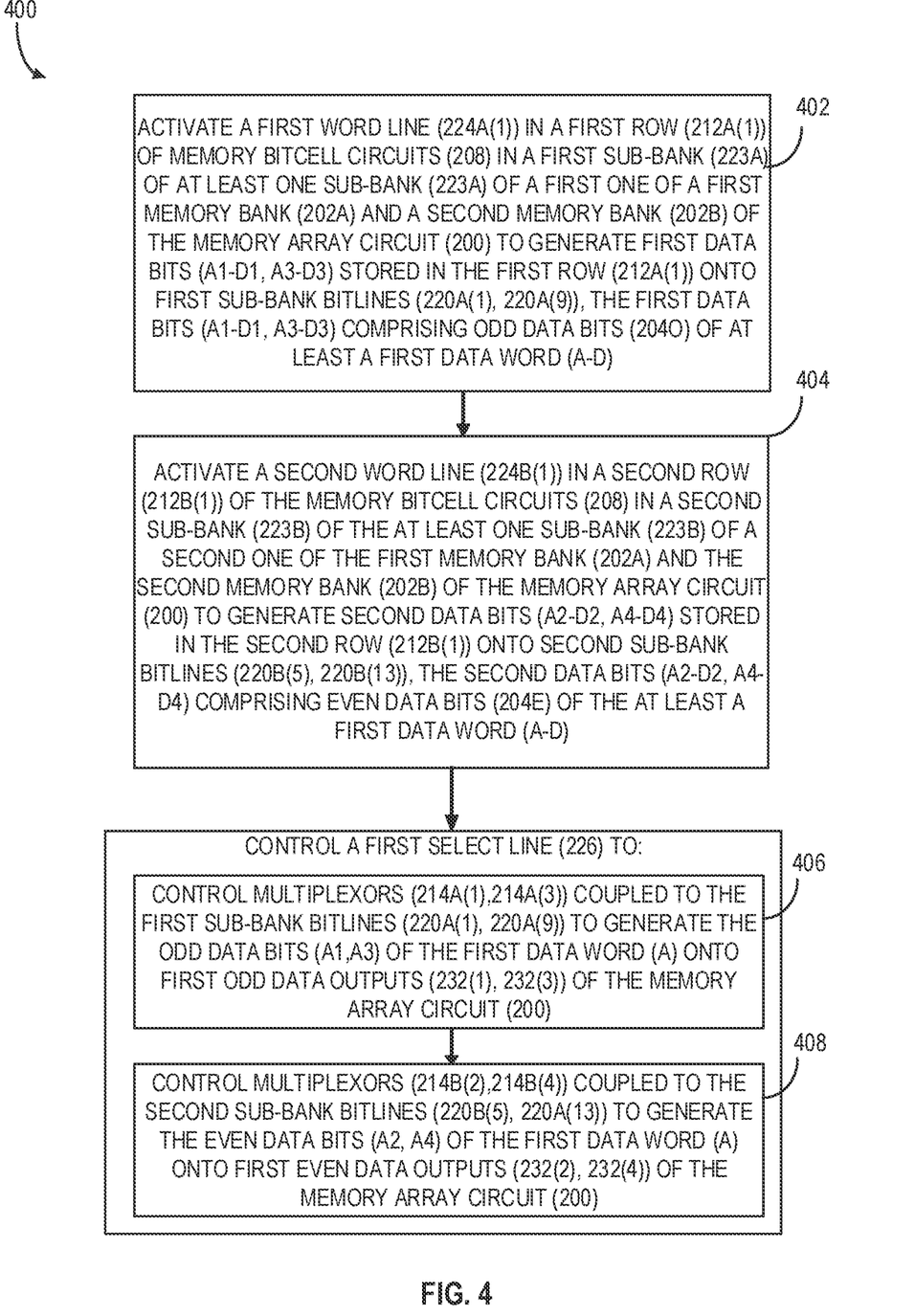
FIG. 4 is a flow chart illustrating a method of reading a first data word out of the memory array circuit of FIG. 2 including a bank array circuit with one or more consecutive columns of a first selected bank of the first and second memory banks coupled to each odd column mux set and one or more consecutive columns of a second selected bank of the first and second memory banks coupled to each even column mux set.

FIG. 4 is a flowchart of a method 400 in the memory array circuit 200 in FIG. 2. The method includes activating a first wordline (224A(1)) in a first memory row (212A(1)) of memory bitcells (208) in first sub-bank (223A) of at least one sub-bank (223A) of a first selected bank of a first memory bank (202A) and a second memory bank (202B) of the memory array circuit (200) to generate first data bits (A1-D1, A3-D3) stored in the first memory row (212A(1)) onto first sub-bank bitlines (220A(1), 220A(9)), the first databits (A1-D1, A3-D3) comprising odd data bits (204O) of at least a first data word (A-D) (block 402). The method further includes activating a second wordline (224B(1)) in a second memory row (212B(1)) of memory bitcells (208) in a second sub-bank (223B) of at least one sub-bank (223B) of a second selected bank of the first memory batik (202A) and the second memory bank (202B) of the memory array circuit (200) to generate second data bits (A2-D2, A4-D4) stored in the second memory row (212B(1)) onto second sub-bank bitlines (220B(5), 220B(13)), the second data bits (A2-D2, A4-D4) comprising even data bits (204E) of the at least a first data word (A-D) (block 404). The method includes controlling a first select line (226) to control multiplexors (214A(1), 214A(3)) coupled to the first sub-bank bitlines (220A(1), 220A(9)) to generate the odd data bits (A1, A3) of the first data word (A) onto first odd data outputs (232(1), 232(3)) of the memory array circuit (200) (block 406) and control multiplexors (214B(2), 214B(4)) coupled to the second sub-bank bitlines (220B(5), 220A (13)) to generate the even data bits (A2, A4) of the first data word (A) onto first even data outputs (232(2), 232(4)) of the memory array circuit (200) (block 408).

Figure 5:
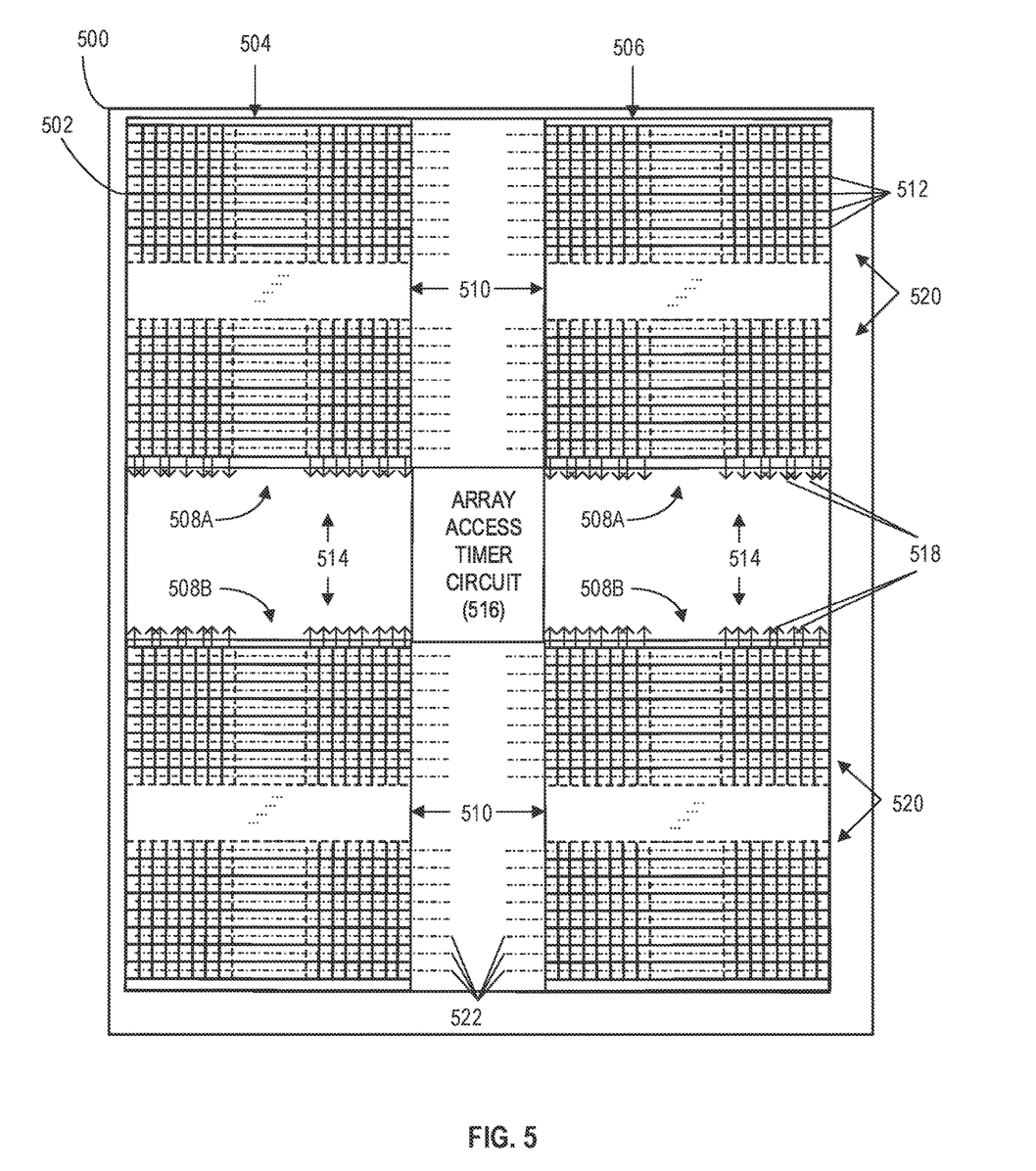
FIG. 5 is an illustration of an integrated circuit including two memory array circuits as shown in FIG. 2, each including two memory banks with odd column mux sets in a first memory bank storing odd data bits of a first data word and even column mux sets in a second memory bank storing even data bits of the first data word.

FIG. 5 is a diagram of an IC 500 including a memory array 502, which further includes memory array circuits 504 and memory array circuit 506, each of which corresponds to either the memory array circuit 200 in FIG. 2 or the memory array circuit 300 in FIG. 3. Each of the memory array circuits 504 and 506 include first memory bank 508A and a second memory bank 508B. Each of the memory banks 508A and 508B include a bank array circuit 510 that may have any number of memory rows 512 and columns 514. Multiplexors and other details of the memory array 502 are not shown in FIG. 5. However, FIG. 5 includes an array access timer circuit 516 to control reading from and writing to the memory array circuits 504 and 506 in the memory array 502. The array access timer circuit 516 controls column circuits (not shown) corresponding to the column circuits 230(1)-230(4) in FIG. 2 and column circuits 320 in FIG. 3. The IC 500 may include additional memory arrays corresponding to the memory array 502, and other circuits, including a processor, for example. Although only one bitline 518 is shown in each column 514 in FIG. 5, the first memory banks 508A and the second memory banks 508B may include one sub-bank 520 or two sub-banks 520, corresponding to the sub-banks 309AI, 309AO, 309BI, and 309BO in FIG. 3. Additional sub-banks (e.g., three or more) could be included in each of the memory banks 508A and 508B by including separate bitlines (not shown) that may be in different levels of metal for each sub-bank 520. Each bitline 518 is coupled to a plurality of memory bitcells in the columns 514 of the memory banks 508A and 508B and also coupled to a multiplexor in a corresponding column mux set (not shown). The word lines 520 for each of the rows 512 are also shown in FIG. 5.

Figure 6:
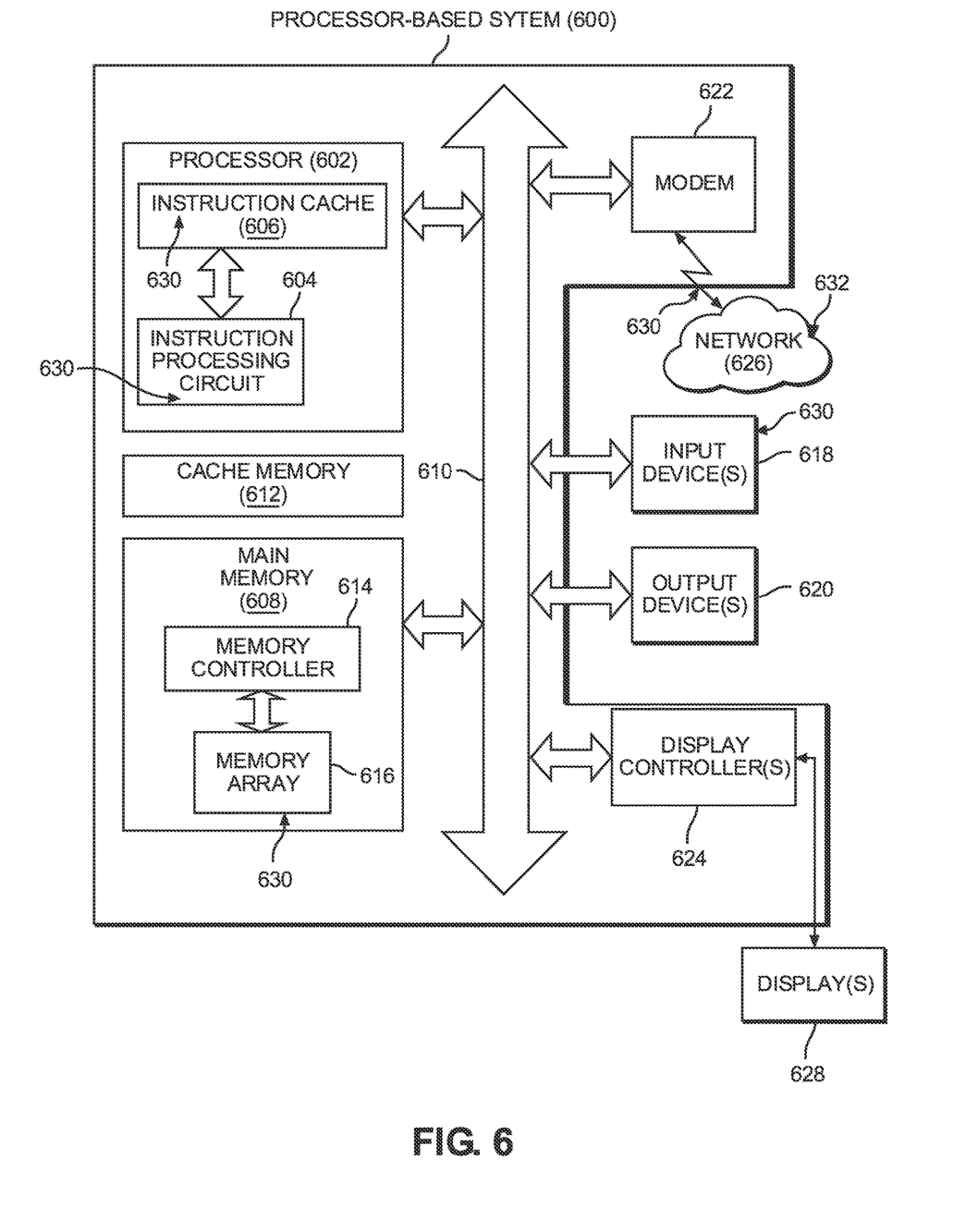
FIG. 6 is a block diagram of an exemplary processor-based system including a plurality of devices coupled to a system bus, wherein the processor-based system includes at least one memory array circuit storing odd data bits of a first data word in odd column mux sets of a first memory bank and even data bits of the first data word in even column mux sets of a second memory bank, as in the memory array circuits shown in FIGS. 2, 3, and 5.

FIG. 6 is a block diagram of an exemplary processor-based system 600 that includes a processor 602 (e.g., a microprocessor) that includes an instruction processing circuit 604. The processor-based system 600 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 600 includes the processor 602. The processor 602 represents one or more general-purpose processing circuits, such as a microprocessor, central processing unit, or the like. More particularly, the processor 602 may be an EDGE instruction set microprocessor, or other processor implementing an instruction set that supports explicit consumer naming for communicating produced values resulting from execution of producer instructions. The processor 602 is configured to execute processing logic in instructions for performing the operations and steps discussed herein. In this example, the processor 602 includes an instruction cache 606 for temporary, fast access memory storage of instructions accessible by the instruction processing circuit 604. Fetched or prefetched instructions from a memory, such as from a main memory 608 over a system bus 610, are stored in the instruction cache 606. Data may be stored in a cache memory 612 coupled to the system bus 610 for low-latency access by the processor 602. The instruction processing circuit 604 is configured to process instructions fetched into the instruction cache 606 and process the instructions for execution.

The processor 602 and the main memory 608 are coupled to the system bus 610 and can intercouple peripheral devices included in the processor-based system 600. As is well known, the processor 602 communicates with these other devices by exchanging address, control, and data information over the system bus 610. For example, the processor 602 can communicate bus transaction requests to a memory controller 614 in the main memory 608 as an example of a slave device. Although not illustrated in FIG. 6, multiple system buses 610 could be provided, wherein each system bus constitutes a different fabric. In this example, the memory controller 614 is configured to provide memory access requests to a memory array 616 in the main memory 608. The memory array 616 is comprised of an array of storage bit cells for storing data. The main memory 608 may be a read-only memory (ROM), flash memory, dynamic random-access memory (DRAM), such as synchronous DRAM (SDRAM), etc., and a static memory (e.g., flash memory, static random-access memory (SRAM), etc.), as non-limiting examples.

Other devices can be connected to the system bus 610. As illustrated in FIG. 6, these devices can include the main memory 608, one or more input device(s) 618, one or more output device(s) 620, a modem 622, and one or more display controllers 624, as examples. The input device(s) 618 can include any type of input device, including but not limited to input keys, switches, voice processors, etc. The output device(s) 620 can include any type of output device, including but not limited to audio, video, other visual indicators, etc. The modem 622 can be any device configured to allow exchange of data to and from a network 626. The network 626 can be any type of network, including but not limited to a wired or wireless network, a private or public network, a local area network (LAN), a wireless local area network (WLAN), a wide area network (WAN), a BLUETOOTH™ network, and the Internet. The modem 622 can be configured to support any type of communications protocol desired. The processor 602 may also be configured to access the display controller(s) 624 over the system bus 610 to control information sent to one or more displays 628. The display(s) 628 can include any type of display, including but not limited to a cathode ray tube (CRT), a liquid crystal display (LCD), a plasma display, etc.

The processor-based system 600 in FIG. 6 may include a set of instructions 630 to be executed by the processor 602 for any application desired according to the instructions. The instructions 630 may be stored in the main memory 608, processor 602, and/or instruction cache 606 as examples of a non-transitory computer-readable medium 632. The instructions 630 may also reside, completely or at least partially, within the main memory 608 and/or within the processor 602 during their execution. The instructions 630 may further be transmitted or received over the network 626 via the modem 622, such that the network 626 includes computer-readable medium 632.

While the computer-readable medium 632 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The processor 602 in the processor-based system 600 may include, in any of the devices therein, a memory array circuit that employs alternating bank column muxing to increase multi-bit error protection with reduced impact on power, performance and area, as in the memory array circuits 200 and 300, as illustrated in FIGS. 2 and 3.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM). Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A memory array circuit comprising:
a first memory bank; and
a second memory bank;
wherein:
 each of the first memory bank and the second memory bank comprises a bank array circuit comprising:
  memory bitcell circuits disposed in columns and memory rows;
  at least one sub-bank comprising a plurality of memory rows; and
  a plurality of column multiplexed (mux) sets, each comprising one or more consecutive columns of the columns, the plurality of column mux sets comprising odd column mux sets alternately disposed with even column mux sets;
 a first memory row of a first sub-bank of the at least one sub-bank in the bank array circuit in a first selected bank among the first memory bank and the second memory bank is configured to store:
  a first odd data bit of a first data word in the memory bitcell circuit in the one or more consecutive columns of a first odd column mux set of the plurality of odd column mux sets of the first selected bank;
  a second odd data bit of the first data word in the memory bitcell circuit in the one or more consecutive columns of a second odd column mux set of the plurality of odd column mux sets of the first selected bank; and
  a first even data bit of a second data word in the memory bitcell circuit in the one or more consecutive columns of a first even column mux set of the plurality of even column mux sets of the first selected bank;
 a first memory row of a second sub-bank of the at least one sub-bank in the bank array circuit in a second selected bank among the first memory bank and the second memory bank is configured to store a first even data bit of the first data word in the memory bitcell circuit in the one or more consecutive columns of a first even column mux set of the plurality of even column mux sets of the second selected bank; and the first odd data bit, the first even data bit, and the second odd data bit are consecutive bits of the first data word.

2. The memory array circuit of claim 1, wherein:

the first memory row of the first sub-bank is configured to store a first even data bit of a second data word in the memory bitcell circuits in the one or more consecutive columns of a first even column mux set of the plurality of even column mux sets of the first selected bank;

the first memory row of the second sub-bank is configured to store a first odd data bit of the second data word in the memory bitcell circuits in the one or more consecutive columns of a first odd column mux set of the plurality of odd column mux sets of the second selected bank; and the first odd data bit of the second data word and the first even data bit of the second data word are consecutive bits.

3. The memory array circuit of claim 2, wherein:

the first memory row of the first sub-bank of the at least one sub-bank in the bank array circuit in the first selected bank is configured to store a first odd data bit of a third data word in the memory bitcell circuits in the one or more consecutive columns of the first odd column mux set of the first selected bank;

the first memory row of the second sub-bank of the at least one sub-bank in the bank array circuit in the second selected bank is configured to store a first even data bit of the third data word in the memory bitcell circuits in the one or more consecutive columns of the first even column mux set of the second selected bank; and the first odd data bit of the third data word and the first even data bit of the third data word are consecutive bits.

4. The memory array circuit of claim 3, wherein:

a second memory row of the first sub-bank of the at least one sub-bank in the bank array circuit in the first selected bank is configured to store a first odd data bit of a fourth data word in the memory bitcell circuits in the one or more consecutive columns of the first odd column mux set of the first selected bank; and a second memory row of the second sub-bank of the at least one sub-bank in the bank array circuit in the second selected bank is configured to store a first even data bit of the fourth data word in the memory bitcell circuits in the one or more consecutive columns of the first even column mux set of the second selected bank; and the first odd data bit of the fourth data word and the first even data bit of the fourth data word are consecutive bits.

5. The memory array circuit of claim 2, wherein:

the first sub-bank of the at least one sub-bank comprises all of the plurality of memory rows in the bank array circuit in the first selected bank; and the second sub-bank of the at least one sub-bank comprises all of the plurality of memory rows in the bank array circuit in the second selected bank.

6. The memory array circuit of claim 5, wherein:

each one of the columns in the bank array circuit in each of the first memory bank and the second memory bank further comprises a bitline coupled to each of the memory bitcell circuits disposed in the one column of the columns;

each of the odd column mux sets comprising at least one odd column of the columns further comprises the bitline of the at least one odd column of the columns coupled to a selection input of one of the odd column mux sets; and each of the even column mux sets comprising at least one even column of the columns further comprises the bitline of the at least one even column of the columns coupled to a selection input of one of the even column mux sets.

7. The memory array circuit of claim 2, wherein:

the plurality of memory rows in the bank array circuit in each of the first memory bank and the second memory bank comprises a plurality of inner memory rows and a plurality of outer memory rows;

the first sub-bank of the at least one sub-bank in the bank array circuit in the first selected bank comprises one of the plurality of inner memory rows and the plurality of outer memory rows in the bank array circuit in the first selected bank; and the second sub-bank of the at least one sub-bank in the bank array circuit in the second selected bank comprises one of:

the other one of the plurality of inner memory rows and the plurality of outer memory rows in the first selected bank;

the plurality of inner memory rows in the second selected bank; and the plurality of outer memory rows in the second selected bank.

8. The memory array circuit of claim 7, wherein:

the plurality of inner memory rows of the bank array circuit in each of the first memory bank and the second memory bank comprise a first plurality of memory bitcell circuits disposed in each column;

the plurality of outer memory rows of the bank array circuit in each of the first memory bank and the second memory bank comprise a second plurality of memory bitcell circuits disposed in each column;

each of the columns in the bank array circuit in each of the first memory bank and the second memory bank further comprises:

an inner sub-bank bitline coupled to each of the first plurality of memory bitcell circuits; and an outer sub-bank bitline coupled to each of the second plurality of memory bitcell circuits;

each of the odd column mux sets comprises the inner sub-bank bitline and the outer sub-bank bitline of each of the one or more consecutive columns of the odd column mux set coupled to the selection inputs of the odd column mux sets; and each of the even column mux sets comprising at least the inner sub-bank bitline and the outer sub-bank bitline of each of the one or more consecutive columns of the even column mux set coupled to the selection inputs of the even column mux set.

9. The memory array circuit of claim 8, the bank array circuit further comprising a wordline coupled to each of the memory bitcell circuits in each of the plurality of memory rows, wherein:

the plurality of inner memory rows of the bank array circuit in the first memory bank comprises the first memory row of the first sub-bank of the at least one sub-bank in the bank array circuit;

the plurality of inner memory rows of the bank array circuit in the second memory bank comprises the first memory row of the second sub-bank of the at least one sub-bank in the bank array circuit;

the wordline in the first memory row in the first sub-bank is configured to be activated to generate the first odd data bit of the at least a first data word on the inner sub-bank bitline in the one or more consecutive columns of the odd column mux sets in the first selected bank; and the wordline in the first memory row in the second sub-bank is configured to be activated to generate the first even data bit of the at least a first data word on the inner sub-bank bitline in the one or more consecutive columns of the even column mux sets of the second one of the first memory bank and the second memory bank.

10. The memory array circuit of claim 9, wherein:
each of the column mux sets of the plurality of column mux sets comprises a multiplexor comprising multiplexor inputs and a multiplexor output; and
the selection inputs of each of the column mux sets comprise the multiplexor inputs.

11. The memory array circuit of claim 10, the bank array circuit further comprising:
a first select line coupled to each of the multiplexors of the odd column mux sets in the first selected bank, the first select line configured to be activated to select, among the one or more consecutive columns in each of the odd column mux sets in the first selected bank, the inner sub-bank bitline corresponding to the first data word; and
a second select line coupled to each of the multiplexors of the even column mux sets in the second selected bank, the second select line configured to be activated to select, among the one or more consecutive columns in each of the even column mux sets, the inner sub-bank bitline corresponding to the first data word.

12. The memory array circuit of claim 10, wherein:
a third select line coupled to each of the multiplexors of the even column mux sets in the first selected bank, the third select line configured to be activated to select, among the one or more consecutive columns in each of the odd column mux sets in the first one of the first memory bank and the second memory bank, the inner sub-bank bitline corresponding to the second data word; and
a fourth select line coupled to each of the multiplexors of the odd column mux sets in the second selected bank, the fourth select line configured to be activated to select, among the one or more consecutive columns in each of the even column mux sets, the inner sub-bank bitline corresponding to the second data word.

13. The memory array circuit of claim 10, wherein
the inner sub-bank bitline, in each of the columns of the plurality of inner memory rows of the bank array circuit in the first memory bank and the second memory bank, is disposed in a first metal layer; and
the outer sub-bank bitline, in each of the columns of the plurality of outer memory rows of the bank array circuit in the first memory bank and the second memory bank, comprises:
a first outer sub-bank bitline section disposed in the first metal layer and coupled to the second plurality of memory bitcell circuits;
a second outer sub-bank bitline section disposed in a second metal layer; and
a vertical interconnect access (via) coupled to the first outer sub-bank bitline section and the second outer sub-bank bitline section.

14. The memory array circuit of claim 9, wherein:
the one or more consecutive columns of each of the column mux sets comprises between one (1) and thirty-two (32) column(s).

15. The memory array circuit of claim 1, wherein:
the first memory bank and the second memory bank are separated in a first direction; and
at least one of the columns in a first odd column mux set in the bank array circuit in the first memory bank is collinear with at least one of the columns in a first odd column mux set in the bank array circuit in the second memory bank.

16. The memory array circuit of claim 14, wherein:
the plurality of inner memory rows of the memory bitcell circuits in the bank array circuit in the first memory bank are on a first side of the first memory bank;
the plurality of outer memory rows of the memory bitcell circuits in the bank array circuit in the first memory bank are on a second side of the first memory bank;
the plurality of inner memory rows of the memory bitcell circuits in the bank array circuit in the second memory bank are on the second side of the second memory bank; and
the plurality of outer memory rows of the memory bitcell circuits in the bank array circuit in the second memory bank are on the first side of the second memory bank.

17. The memory array circuit of claim 10, wherein:
the multiplexor in each of the column mux sets of the bank array circuits in the first memory bank and the second memory bank are disposed in a middle area between the inner memory rows of the first memory bank and the inner memory rows of the second memory bank.

18. A method in a memory array circuit, comprising:
activating a first wordline in a first memory row of memory bitcell circuits in a first sub-bank of at least one sub-bank of a first selected bank of a first memory bank and a second memory bank of a memory array circuit to generate first data bits stored in the first memory row onto first sub-bank bitlines, the first data bits comprising a first odd data bit and a second odd data bit of a first data word, wherein activating the first wordline in the first memory row of memory bitcell circuits in the first sub-bank generates second data bits stored in the first memory row onto second sub-bank bitlines, the second data bits comprising a first even data bit of a second data word;

activating a second wordline in a second memory row of memory bitcell circuits in a second sub-bank of at least one sub-bank of a second selected bank of the first memory bank and the second memory bank of the memory array circuit to generate second data bits stored in the second memory row onto second sub-bank bitlines, the second data bits comprising a first even data bit of the first data word; and controlling a first select line to:
control multiplexors coupled to the first sub-bank bitlines to generate the first odd data bit of the first data word on a first odd data output, the second odd data bit of the first data word on a second odd data output of the memory array circuit; and control multiplexors coupled to the second sub-bank bitlines to generate the first even data bit of the first data word onto a first even data output of the memory array circuit.

19. The method of claim 18, further comprising:

activating the first wordline to generate third data bits stored in the first memory row onto third sub-bank bitlines, the third data bits comprising a first even data bit of a second data word interleaved with the even data bits of at least the first data word;

activating the second wordline to generate fourth data bits stored in the second memory row onto fourth sub-bank bitlines, the fourth data bits comprising a first odd data bit and a second odd data bit of the second data word interleaved with the odd data bits of at least the first data word; and controlling a second select line to:
  control multiplexors coupled to the third sub-bank bitlines to generate the even data bits of the second data word on the second even data outputs of the memory array circuit; and
  control multiplexors coupled to the fourth sub-bank bitlines to generate the odd data bits of the second data word onto the first odd data output and the second odd data output of the memory array circuit.

20. The method of claim 18, wherein:

controlling the first select line to control multiplexors coupled to the first sub-bank bitlines further comprises controlling multiplexors coupled to a plurality of odd column mux sets in the first memory bank, each column mux set comprising a plurality of columns comprising first columns comprising the first sub-bank bitlines; and controlling the first select line to control multiplexors coupled to the second sub-bank bitlines further comprises controlling multiplexors coupled to a plurality of even column mux sets in the second memory bank, each column mux set comprising a plurality of columns comprising second columns comprising the second sub-bank bitlines.

21. The method of claim 19, wherein:

controlling the second select line to control multiplexors coupled to the third sub-bank bitlines further comprises controlling multiplexors coupled to a plurality of even column mux sets in the first memory bank, each column mux set comprising a plurality of columns comprising third columns comprising the third sub-bank bitlines; and controlling the second select line to control multiplexors coupled to the fourth sub-bank bitlines further comprises controlling multiplexors coupled to a plurality of odd column mux sets in the second memory bank, each column mux set comprising a plurality of columns comprising fourth columns comprising the fourth sub-bank bitlines.

* * * * *